United States Patent [19]

Ricketson et al.

[11] Patent Number: 4,765,531
[45] Date of Patent: Aug. 23, 1988

[54] QUICK CHANGE WORK STATION APPARATUS FOR AUTOMATIC WIRE BONDERS

[75] Inventors: Tommy H. Ricketson, Danboro; Mark W. Klug, Doylestown; John J. McGlory, Chalfont; David W. Smith, Carversville, all of Pa.

[73] Assignee: Kulicke and Soffa Industries Inc., Willow Grove, Pa.

[21] Appl. No.: 50,242

[22] Filed: May 14, 1987

[51] Int. Cl.⁴ ............................................. B23K 31/02
[52] U.S. Cl. ..................................... 228/179; 228/4.5
[58] Field of Search .................. 228/4.5, 6.1, 44.7, 228/179, 180.1, 180.2; 269/309, 310, 903

[56] References Cited

U.S. PATENT DOCUMENTS

| | | | |
|---|---|---|---|
| 3,941,297 | 3/1976 | Burns et al. | 228/179 |
| 3,949,925 | 4/1976 | Keizer et al. | 228/180.2 |
| 4,500,031 | 2/1985 | Pettingell | 228/44.7 |

Primary Examiner—M. Jordan
Attorney, Agent, or Firm—John B. Sowell

[57] ABSTRACT

A modular quick change work station is provided for automatic wire bonders which permits the rapid exchange of work stations without manual adjustments for continuing operations. The modular work station comprises a fixed portion and a movable portion. The fixed portion is affixed to a fixed portion of the wire bonder and the movable portion is affixed to a movable portion of the wire bonder. In order to install the modular work station in a precise position relative to both the fixed and movable portions of the wire bonder the novel modular work station is provided with immobilizing means and a plurality of alignment means which align all of the working parts with each other and with the moving and fixed parts of the automatic wire bonder. Thus, when the modular work station is installed into the automatic wire bonder and properly mobilized the work station is adjusted for proper production operation without further adjustment.

15 Claims, 4 Drawing Sheets

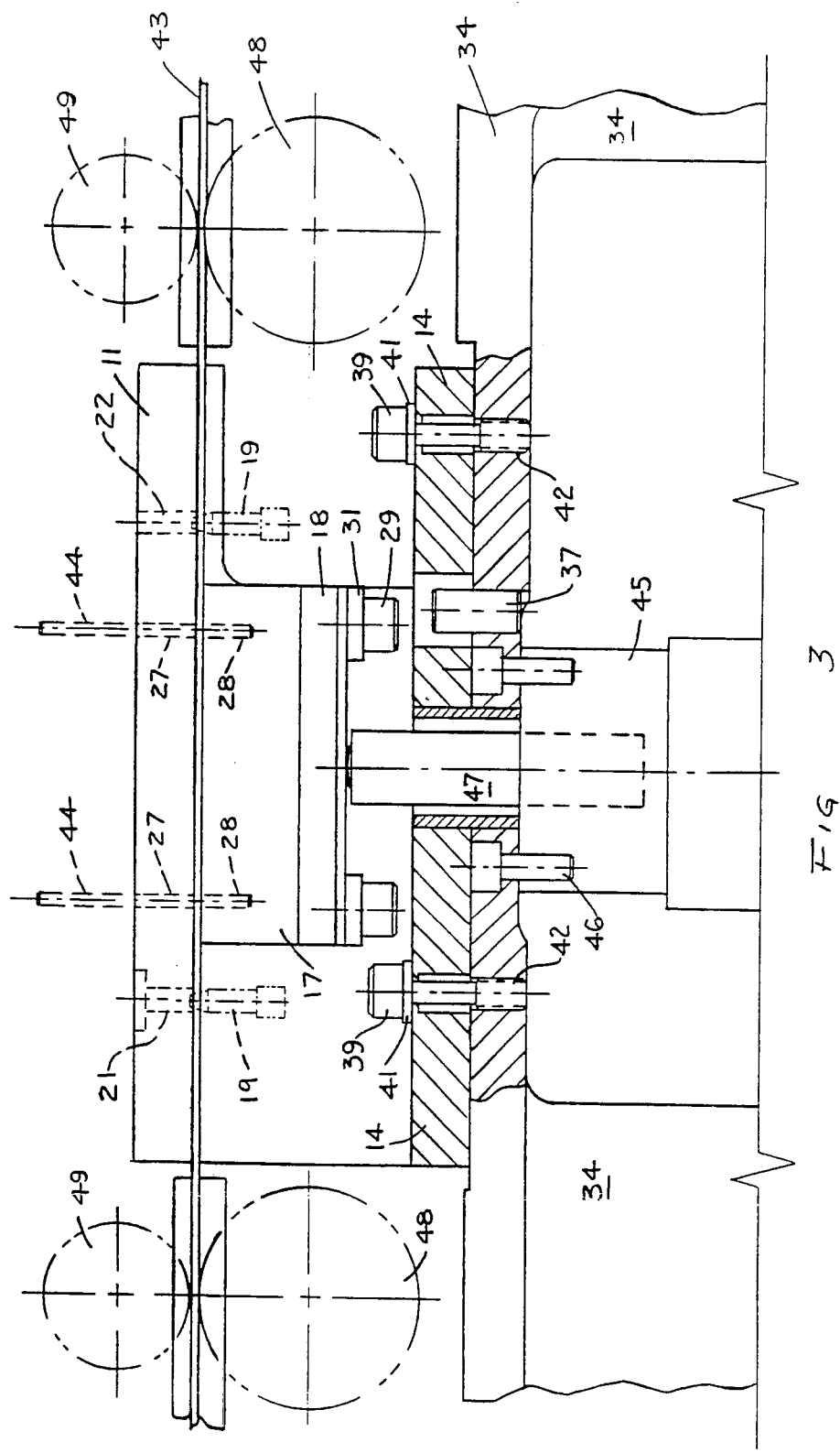

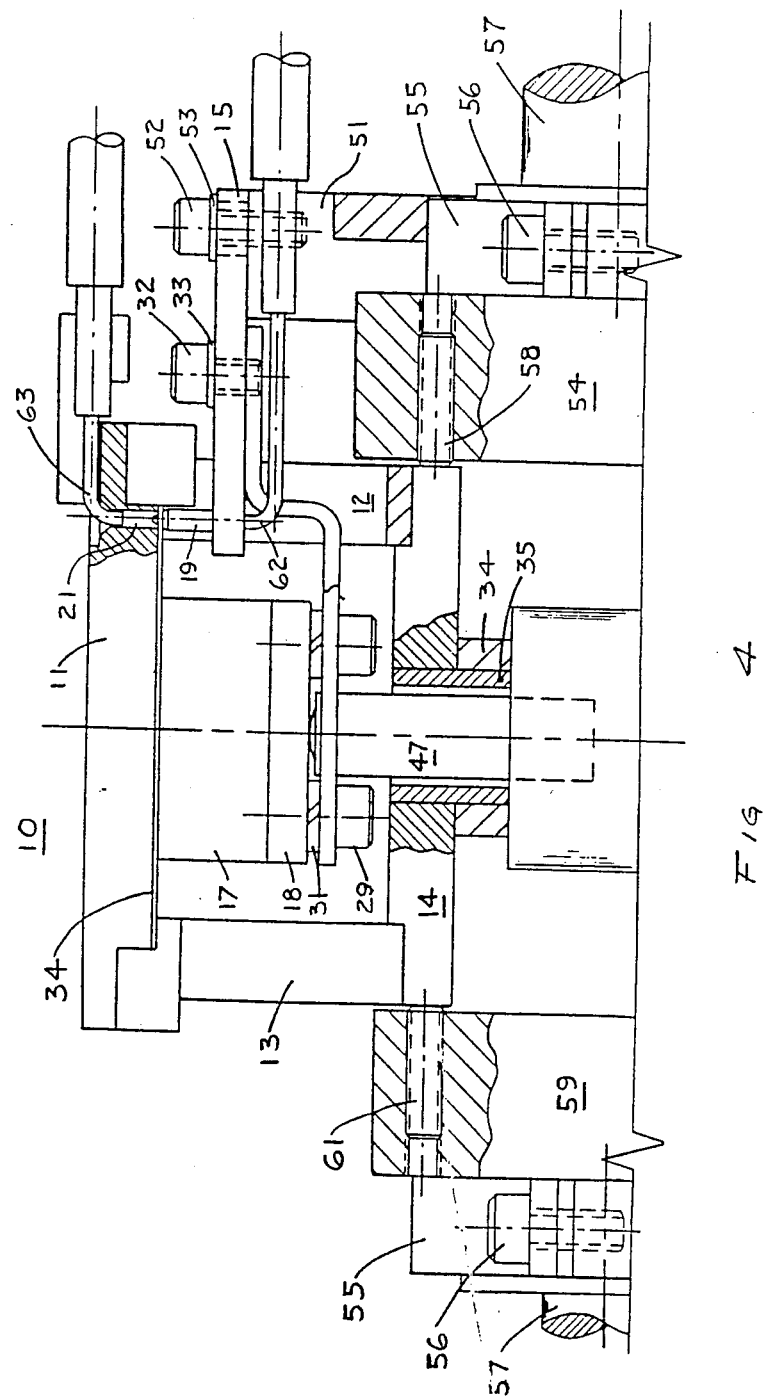

QUICK CHANGE WORK STATION APPARATUS FOR AUTOMATIC WIRE BONDERS

BACKGROUND OF THE INVENTION

1. Field of the Invention

The present invention relates to work stations or work holders employed in automatic wire bonders and more particularly to a modular work station or work holder which is adapted to be rapidly removed and rapidly replaced by another modular work station to minimize down time in an automatic wire bonder.

2. Description of the Prior Art

The present invention is an improvement of prior art work holders or work stations which have been incorporated into automatic wire bonders made by Kulick and Sofa Industries, Inc. of Willow Grove, Pa. under model designations 1481 and 1482. Such automatic wire bonders are commercially available and have heretofore had dedicated work holders or work stations adapted to receive lead frames. Such work stations may be changed by disassemblying and reassemblying or partially rebuilding the automatic wire bonder. Such changes require an inordinate amount of time. Such prior art work stations are coupled to or connected to at least three mechanical drives, one for advancing the lead frame, one for positioning the lead frame on the bonding station and one or more drives for clamping the lead frame in the station. When another work station of different size was required to accommodate a different size lead frame in the prior art, individual parts of the prior art work station were moved, disassembled, and/or removed in the process of rebuilding a new work station into an automatic wire bonder.

Work stations or work holders for prior art manual or semiautomatic wire bonders did not employ automatic indexing, automatic positioning, automatic clamping of the lead frame and other automatic sensing operations, thus, could be considered integral units which could be replaced rapidly because there were none of the aforementioned mechanical drives connected to the work station.

Heretofore, it was necessary to employ a highly skilled technician trained to set up and test a production machine under process conditions whenever an automatic wire bonder required a new work station change because the drive mechanisms, feed mechanisms, positioning mechanisms as well as clamping and sensing mechanisms were changed with a work station change on the prior art type automatic wire bonders.

Quite often a plurality of automatic wire bonders are monitored by a single operator. When one of the automatic wire bonders is out of service, the production of the machine is lost and the prorata share of the time of the operator is lost thus increasing the cost of operation of the remaining machines. In modern production facilities expensive automatic wire bonders cannot be dedicated to low production items or even to batch production which is intermittent. The most economical production use of such automatic wire bonders has heretofore been to keep the bonder on line as long as possible during a work shift.

It would be extremely desirable to provide a modular work station or work holder for an automatic wire bonder which would permit changing from one lead frame in production to another size lead frame in production in minutes instead of hours and would then require only the minimum change of electronic data input to the automatic wire bonders computer to commence production employing the new lead frame.

SUMMARY OF THE INVENTION

It is a principal object of the present invention to provide a modular work station or work holder which is easily removed from and/or replaced in an automatic wire bonder.

It is another primary object of the present invention to provide a modular work station or work holder which has means for immobilizing the moving parts of the modular work station relative to the fixed parts of the work station so that the precise relative position of the components is retained during quick installation of the unit.

It is yet another principal object of the present invention to provide lead frame positioning and alignment means which also serve to align the moving components of the work station with the fixed components of the work station.

It is a general object of the present invention to provide a modular workstation that aligns itself in an automatic wire bonder as a result of being properly bolted and installed in place.

It is another general object of the present invention to provide a modular work station for an automatic wire bonder which may be bolted into an operable working position in a matter of minutes.

According to these and other objects of the present invention there is provided a modular work station for automatic wire bonder comprising a top plate, bottom plate and a pair of side rails connected thereto as a rigid hollow box adapted to be bolted to a fixed frame member of an automatic wire bonder in a precise predetermined position without manual adjustment. The bonding station further comprises a precisor plate having a heating block mounted thereon and alignment pins for positioning a lead frame relative to said top plate. The alignment pins on the precisor plate further serve to align the precisor plate in an exact predetermined position relative to said top plate. The precisor plate is adapted to be bolted to a moving drive member while precisely located relatively to said top plate in an immobilized condition and when subsequently mobilized, the moving parts of the work station are exactly aligned with the fixed parts as a result of having been bolted into operable working position.

BRIEF DESCRIPTION OF THE DRAWINGS

FIG. 3 is an enlarged, detailed partial section and front elevation of the assembled modular work station of FIG. 2; and FIG. 4 is an enlarged, detailed partial section and side elevation of the assembled modular work station of FIG. 2.

DESCRIPTION OF THE PREFERRED EMBODIMENT

Figure 1:
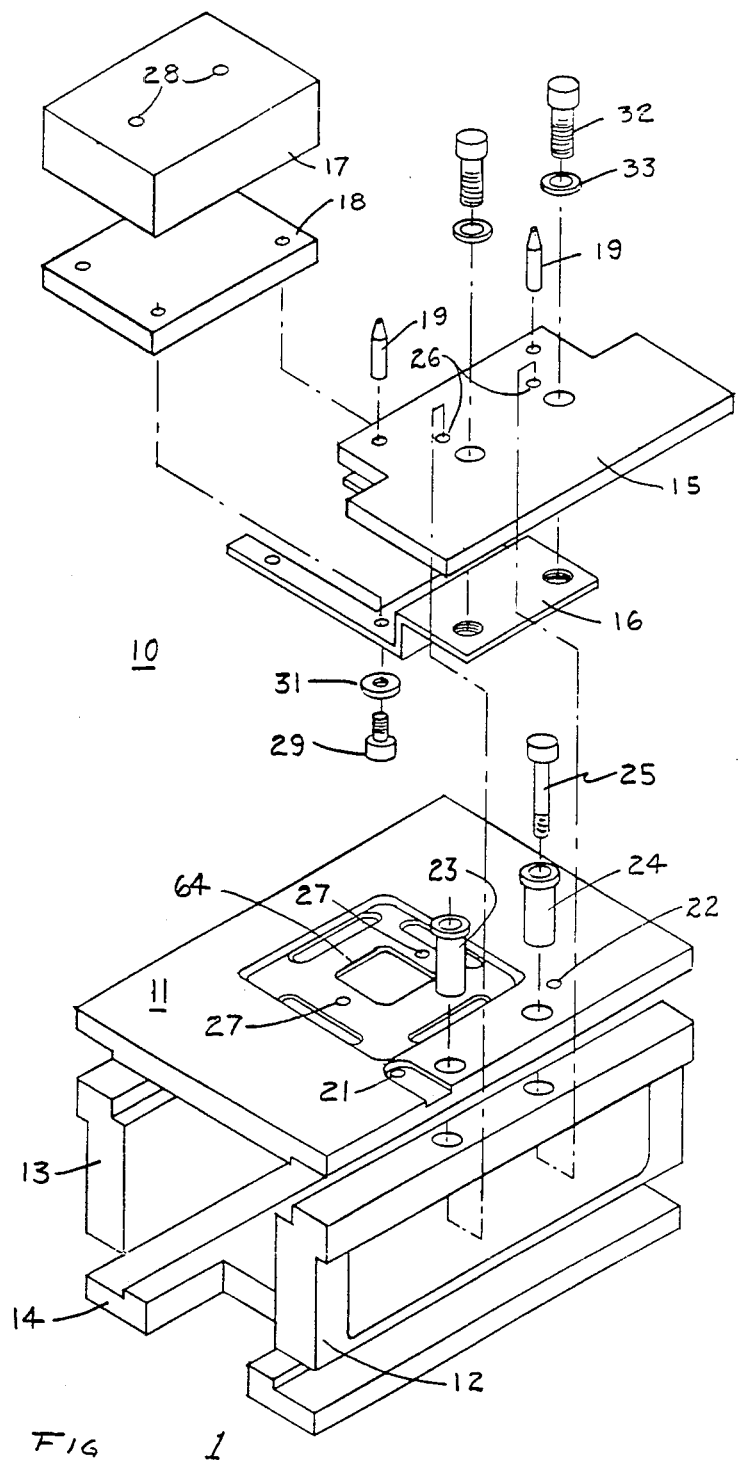
FIG. 1 is an exploded isometric view of a preferred embodiment modular work station.

Refer now to FIG. 1 showing the principal elements of the bonding station 10 in an explored isometric view. The term bonding station and work station and work holder as used herein have the same meaning when referring to the preferred embodiment modular work station. The modular work station or bonding station 10 comprises a hollow box shaped fixture having a top plate 11, a pair of side rails 12 and 13 and a bottom plate 14. The bottom plate 14 is adapted to be precisely connected to the frame of an automatic wire bonder as will be explained hereinafter. By accurately connecting the work station 10 on the frame of the automatic wire bonder it becomes accurately located in the automatic wire bonder system thus no further adjustments are required for the fixed portion of the modular work station 10.

The modular work station further comprises a movable portion having a precisor plate 15 which supports a downward and outward extending Z shaped plate 16 adapted to be connected to and support a heat block 17 and insulating plate 18. Alignment pins 19 on the precisor plate are provided with frustroconical tips adapted to be engaged in the bottom opening of cylindrical apertures 21 and 22 respectively for the purpose of precisely aligning the precisor plate 15 relative to the top plate 11. In the immobilized or stored condition, pins 19 are engaged in their respective alignment recesses 21 and 22 and precisor plate 15 is held parallel to the bottom of top plate 11 by flanged cylindrical sleeves 23 and 24. Cap screws 25 fasten into the threaded recesses 26 in precisor plate 15. Flange sleeves 23 serve as precision spacer sleeves to prevent damage to the alignment pins 19 when forced into recesses 21 and 22 by cap screws 25 when there is no lead frame in the work station 10.

In the preferred embodiment of the present invention the top plate 11 serves also as a reference plane and provides reference points for which the fixed and moving portions of the work station 10 are all referenced. Heat block 17 is referenced to the top plate 11 by alignment rods (not shown) which extend through guide holes 27 in top plate 11 and extend, when aligned, into guide holes 28 in heat block 17. Once aligned with the top plate, screws 29 and lock washers 31 are tightened permanently setting the heat block relative to the alignment pins 19 on precisor plate 15 and the alignment rods are not further required.

As explained herein before, alignment pins 19 positioned precisor plate 15 relative to top plate 11 and also hold this relative position when sleeves 23, 24 and screws 25 are installed. Also, screws 32 and lock washers 33 hold Z-shape plate 16 in a precise position relative to precisor plate 15 and need not be changed after initial assembly.

Figure 2:
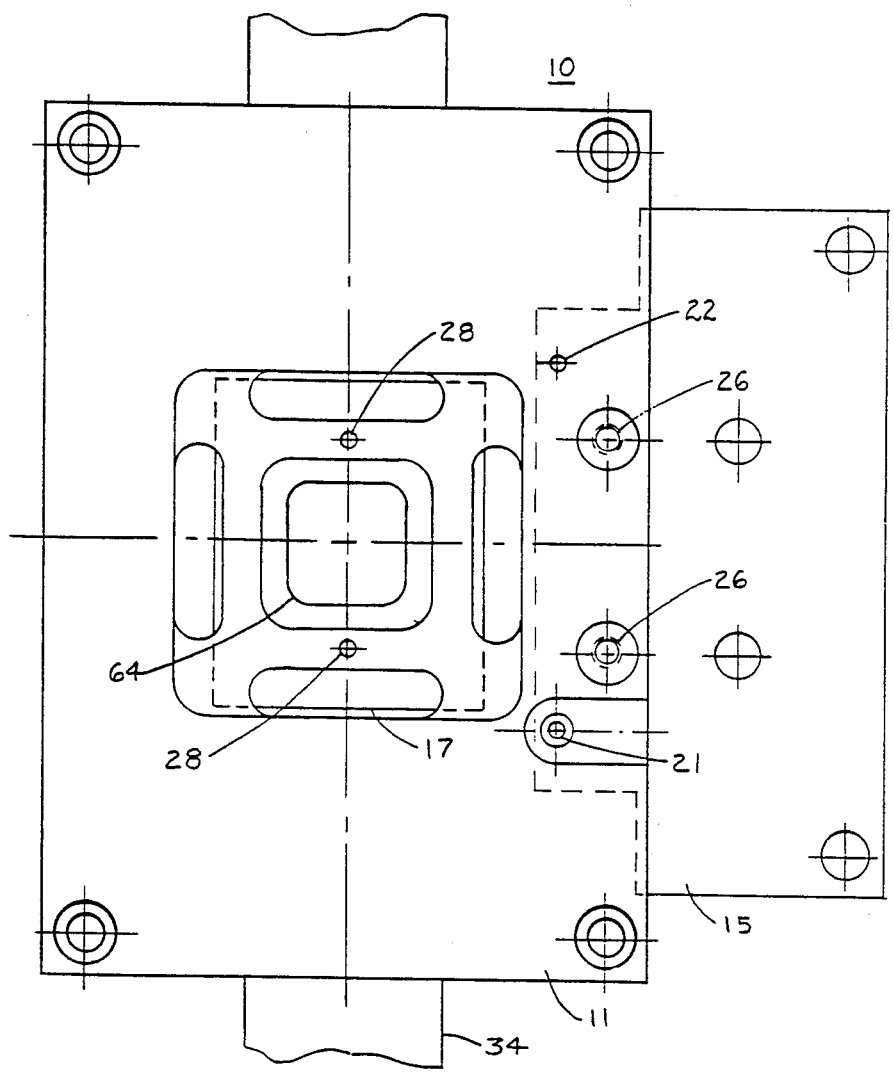
FIG. 2 is an enlarged, detailed top view of the assembled modular work station of FIG. 1.

Refer now to FIG. 2 showing an enlarged detail top view of the modular work station 10 assembled in the form ready for installation on or into an automatic wire bonder. Top plate 11, precisor plate 15 and heat block 17 are shown in their relative positions when immobilized as well as their operating positions, thus, when work station 10 is installed on fixed center frame 34 and then mobilized the work station is precisely aligned for operation without the need for further setting any part of the work station 10. Recesses 21, 22 align pins 19. Screws 32 align plate 16 and guide holes 28 and their associated guide rods align the heat block 17 all relative to the precisor plate 15 and top plate 11 as explained hereinbefore.

Refer now to FIGS. 3 and 4 drawn to the same scale as FIG. 2 and showing an enlarged front and an enlarged side elevation in partial section. The immobilized work station 10 is mounted on the fixed center frame 34 in a precise position. To accurately locate the work station 10 there is provided a bushing 35 which is fixed into frame 34 and extends into aperture 36 of the bottom plate 14. To prevent rotational movement a dowel pin 37 also extends from frame 34 into a rectangular slot 38 in bottom plate 14. Thus, when work station 10 is placed on bushing 35 and dowel pin 37 it is exactly located in place on the fixed center frame 34. Captive cap screws 39 and lock washers 41 extend into threaded apertures 42 in fixed frame 34 for locking the work station 10 into a preferred fixed position.

For purposes of illustration only, a lead frame 43 is shown in a bonding position with alignment pins 19 engaged in the index holes (not shown) in the lead frame and not in the cylindrical recesses 21 and 22 described hereinbefore. Also shown for illustration purposes only are guide rods 44 which extend into the guide holes 27 and 28 in the top plate and heat block respectively. It will be understood that the guide rods 44 are removed after the assembly operation of the work station 10 and are not further required. The lead frame 43 is shown in the clamp position where it is clamped by the heat block 17 as a result of actuation of the precisor plate 15. After being clamped in position, the lead frame 43 is further clamped by means of an air cylinder 45 which is located inside the frame 34 and held in place by cap screws 46 the piston or actuating rod 47 of air cylinder 45. The additional pressure provided by piston 47 provides stability and rigidity to the heat block 17 so that the lead frame 43 appears as a solid stable mass to the automatic wire bonder. After the bonding operation the drive rollers 48 are acutation by the automatic wire bonder and cooperate with the pinch rolls 49 to move the lead frame 43 to the next index position once the alignment pins 19 are lowered out of the index holes of the lead frame 43.

Refer now to FIG. 4 showing the lead frame 34 in a bonding position after installation of the work station 10. It was explained hereinbefore that the work station 10 is immobilized when being installed on the fixed center frame 34. The pilot bushing 36 which was fixed in center frame 34 is also shown for reference. The aforementioned precisor plate 15 was explained as being moved up and down vertically and is shown attached to a vertical slider 51 by cap screws 52 and lock washers 53. It will be understood that the work station is first mounted on the center frame 34 while immobilized and then the precisor plate 15 is locked to the slider 51 so that it too is in a precise position relative to the top plate by virtue of the alignment pins 19 which would in the immobilized condition be cooperating with cylindrical recesses 21 and 22. By virtue of locking the precisor plate in its operating position while the alignment pins 19 are in the cylindrical recesses 21 and 22 the precisor plate is properly aligned for production operation. A slider 51 is mounted for vertical movement on the movable front frame 54 which is locked in place by a split clamp 55 and locking screw 56. It will be understood that the front frame member is movable on a pair of shaft members 57 and when properly indexed by set screws 58 engaging a side edge of bottom plate 14 properly positioned both the front frame member 54 and the slider 51 in the proper operating position. Similarly, the rear frame member 59 is movable on the same shaft 57 which is a part of the base of the automatic wire bonder and set in place by set screws 61 cooperating with a finished edge of the bottom plate 14. There are further provided a split clamp 55 and locking screw 56 to hold the rear frame in place.

In the preferred embodiment shown the alignment pin 19 shown in FIG. 4 is hollow and receives a fiber optic bundle 62, which is inside of a tube at 62, extends to the top and hollow opening of the frustroconical guide portion of alignment pin 19. The lower fiberoptic bundle 62 is the receiver for the fiberoptic bundle 63 inside of a protective tube which supplies a light signal when the lead frame is in place before starting the bonding operation. If the light from the sending optical bundle 63 is received by the receiving optical bundle 62 and a lead frame is in the work station 10 then it can be assumed that the alignment pin 19 extends through the index hole in the lead frame 34 and the device on the lead frame in the aperture 64 of the top plate is in the proper position for bonding operation and the bonding operation proceeds automatically.

Having explained a preferred embodiment of the present invention describing a modular work station for installation into an existing commercially available Kulick and Soffa Industries model 1482 automatic wire bonder it will be understood that the present invention may be retrofitted into thousands of such automatic wire bonders which presently exist in the field. The principal feature of the present invention is the fact that the modular work station can easily be installed into an existing automatic wire bonder in approximately six and a half minutes whereas in the prior art a change of work station in the model 1482 automatic wire bonders required a minimum of two hours and could very well interrupt a work shift. Thus, the present invention modular work station no longer requires the expertise of a highly trained technician but may be installed by an operator trained to reprogram the computer to properly index the new lead frame and set the production controls for operation as was done in the prior art after bolting in a new modular work station of the type described hereinbefore.

What we claim is:

1. A quick change method for exchanging work stations and an automatic wire bonder comprising the steps of:
    providing an automatic wire bonder of the type adapted to receive a modular work station,
    stopping said wire bonder,
    immobilizing said work station,
    disconnecting the precisor plate from the drive mechanism of said wire bonder,
    lifting said work station from said automatic wire bonder,
    placing a new work station in said automatic wire bonder on precision locating means,
    connecting the precisor plate of said new work station to the drive means of said wire bonder, and
    removing the immobilizing means from said new work station.

2. A quick change work station for automatic wire bonders of the type adapted to wire bond semiconductor devices to fingers of a lead frame, comprising:
    a front mounting frame,
    a fixed center mounting frame,
    locating means on said center mounting frame,
    a modular bonding work station,
    locating means on said work station for precisely mounting said work station on said center mounting frame locating means,
    said modular bonding work station comprising a top plate, a bottom plate and a pair of side rails fixed on said center mounting frame for guiding a lead frame through said bonding station,
    said modular bonding work station further comprising a precisor plate adapted to be mounted on a vertically movable plate on said front mounting frame, and a heat block mounted on said precisor plate for clamping said lead frame against said top plate,
    alignment pin means on said precisor plate cooperable with apertures in said top plate for precisely locating said movable precisor plate in said bonding work station during installation of said bonding station,
    said alignment pin means on said precisor plate being cooperable with index holes in said lead frames for precisely locating said lead frame relative to said top plate, and
    adjustable fastening means for connecting said precisor plate to said vertically movable plate in a precise position relative to said top plate of said bonding work station during installation of said bonding station.

3. A quick change work station as set forth in claim 2 wherein said front mounting frame is movable in a horizontal direction relative to said fixed center frame and further includes positioning means on said front mounting frame for positioning said front mounting frame relative to said fixed center frame.

4. A quick change work station as set forth in claim 3 wherein said positioning means comprises set screw means mounted in said front mounting frame.

5. A quick change work holder as set forth in claim 4 wherein said set screw means are engagable with the side of said work station of said modular bonding station fixed on said fixed center frame.

6. A quick change work station as set forth in claim 5 which further includes a rear mounting frame having set screw positioning means therein engagable with the sides of said modular bonding station.

7. A quick change work station as set forth in claim 2 wherein said locating means on said center mounting frame comprises a precision male bushing and a dowel pin.

8. A quick change work station as set forth in claim 7 wherein said locating means on said bonding work station comprise an aperture for receiving said male bushing and a slot for receiving said dowel pin.

9. A quick change work holder as set forth in claim 2 which further includes a plurality of guide rods removably mounted through said top plate and into said heat block of said modular work station for aligning said heat block on said precisor plate and for aligning said heat block relative to said top plate.

10. A quick change work station as set forth in claim 9 wherein said precisor plate further includes a pair of downward depending arms adapting to be connected to said heat block when aligned by said guide rods.

11. A quick change work station as set forth in claim 2 which further includes spacing means for holding said precisor plate parallel to said top plate when said alignment pin means on said precisor plate are engaged in said apertures in said top plate of said work station.

12. A quick change work station as set forth in claim 11 wherein said spacing means comprise a pair of spacer sleeves and cooperating cap screws fitted through apertures in said top plate, said cap screws being screw mounted in said precisor plate to a depth limited by said alignment pins.

13. A quick change work station as set forth in claim 12 wherein said spacing means are adapted to immobilize said precisor plate and are removable after installation of said work station.

14. A quick change work station as set forth in claim 2 which further include pinch roll drive means mounted on said front mounting frame for transporting said lead frame in said work station.

15. A quick change work station as set forth in claim 11 wherein said precisor plate is mounted for vertical movement on a slider plate for moving said heat block into engagement with said lead frame, and further includes air cylinder means on said fixed center mounting frame for rigidly clamping said lead frame against said top plate during a bonding operation.

* * * * *